US 7,368,989 B2

(12) United States Patent
Luo et al.

(10) Patent No.: US 7,368,989 B2
(45) Date of Patent: May 6, 2008

(54) HIGH BANDWIDTH APPARATUS AND METHOD FOR GENERATING DIFFERENTIAL SIGNALS

(75) Inventors: Wenzhe Luo, Shanghai (CN); Paul Ouyang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 11/678,467

(22) Filed: Feb. 23, 2007

(65) Prior Publication Data

US 2007/0197105 A1    Aug. 23, 2007

Related U.S. Application Data

(63) Continuation of application No. 11/156,236, filed on Jun. 17, 2005, now Pat. No. 7,205,839.

(30) Foreign Application Priority Data

May 30, 2005    (CN) .................... 2005 1 0026471

(51) Int. Cl.
*H03F 3/45*    (2006.01)
(52) U.S. Cl. .................. 330/258; 330/253; 330/260
(58) Field of Classification Search ............ 330/258, 330/260, 253
See application file for complete search history.

(56) References Cited

U.S. PATENT DOCUMENTS

| | | | | |
|---|---|---|---|---|
| 5,404,097 A | * | 4/1995 | Barou | 323/312 |
| 6,346,856 B1 | * | 2/2002 | Myers et al. | 330/252 |
| 6,838,943 B2 | * | 1/2005 | Zamir et al. | 330/304 |
| 6,906,586 B2 | * | 6/2005 | Sakurai | 330/253 |
| 7,002,405 B2 | * | 2/2006 | Brooks et al. | 327/563 |
| 7,233,204 B2 | * | 6/2007 | Kim et al. | 330/260 |

\* cited by examiner

*Primary Examiner*—Patricia Nguyen
(74) *Attorney, Agent, or Firm*—Townsend and Townsend and Crew, LLP

(57) ABSTRACT

An apparatus and method for generating differential signals. The apparatus includes a first operational amplifier receiving a first signal, a second operational amplifier receiving a second signal, and a first transistor. The first transistor includes a first gate, a first terminal, and a second terminal. Additionally, the apparatus includes a second transistor. The second transistor includes a second gate, a third terminal, and a fourth terminal. Moreover, the apparatus includes a first resistor coupled to the first terminal and the third terminal, and a second resistor coupled to the second terminal and the fourth terminal. Also, the apparatus includes a first current supplier coupled to the first terminal, a second current supplier coupled to the second terminal, a third current supplier coupled to the third terminal, and a fourth current supplier coupled to the fourth terminal.

19 Claims, 2 Drawing Sheets

HIGH BANDWIDTH APPARATUS AND METHOD FOR GENERATING DIFFERENTIAL SIGNALS

CROSS-REFERENCES TO RELATED APPLICATIONS

This application is a continuation of U.S. patent application Ser. No. 11/156,236, filed Jun. 17, 2005 now U.S. Pat. No. 7,205,839, which claims priority to Chinese Patent Application No. 200510026471.0, filed May 30, 2005, entitled "High Bandwidth Apparatus and Method for Generating Differential Signals," by Inventors Wenzhe Luo and Paul Ouyang. All applications are commonly assigned and incorporated by reference herein for all purposes.

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed to integrated circuits. More particularly, the invention provides an apparatus and method for generating differential signals. Merely by way of example, the invention has been applied to an analog-to-digital converter. But it would be recognized that the invention has a much broader range of applicability.

The analog-to-digital converters have been widely used for converting an analog input signal to a digital output signal. For example, the analog-to-digital converters are often required for providing analog signals to digital circuits. The analog input signals are usually continuous in time and amplitude, and the digital output signals are often discrete in time and amplitude.

Some analog-to-digital converters each include a comparator to successively compare an analog signal to several reference signals. These converters are often slow because a series of comparisons usually has to be performed in order to convert the analog signal to a digital signal. Other analog-to-digital converters are flash converters. The flash converters often use many comparators to simultaneously compare an analog signal to several reference signals. These comparators can simultaneously provide bits for a digital signal.

The conventional analog-to-digital converters often use differential mechanism. The differential mechanism converts a single-ended input signal to differential input signals. For example, the differential conversion is performed by a charge and transfer circuit. The charge and transfer circuit usually performs well for low and medium frequencies, but for high sampling frequencies, such as one that is higher than 100 MHz, the charge and transfer circuit often cannot easily achieve conversion accuracy better than eight bits. In another example, the differential conversion is performed by a high-speed operational amplifier. The operational amplifier often consumes significant current and introduces extra noises. In yet another example, the differential conversion is accomplished by a transformer. But the transformer cannot be easily integrated onto a digital circuit chip in many applications.

From the above, it is seen that an improved technique for generating differential signals is desired.

BRIEF SUMMARY OF THE INVENTION

The present invention is directed to integrated circuits. More particularly, the invention provides an apparatus and method for generating differential signals. Merely by way of example, the invention has been applied to an analog-to-digital converter. But it would be recognized that the invention has a much broader range of applicability.

In a specific embodiment, the invention provides an apparatus for generating differential signals is provided. The apparatus includes a first operational amplifier receiving a first signal, a second operational amplifier receiving a second signal, and a first transistor. The first transistor includes a first gate, a first terminal, and a second terminal. Additionally, the apparatus includes a second transistor. The second transistor includes a second gate, a third terminal, and a fourth terminal. Moreover, the apparatus includes a first resistor coupled to the first terminal and the third terminal, and a second resistor coupled to the second terminal and the fourth terminal. Also, the apparatus includes a first current supplier coupled to the first terminal, a second current supplier coupled to the second terminal, a third current supplier coupled to the third terminal, and a fourth current supplier coupled to the fourth terminal. The gate of the first transistor is coupled to the first operational amplifier, the gate of the second transistor is coupled to the second operational amplifier, the second terminal is configured to output a third signal, and the fourth terminal is configured to output a fourth signal. A first difference between the fourth signal and the third signal is substantially proportional to a second difference between the first signal and the second signal.

In another embodiment, an apparatus for generating differential signals includes a first operational amplifier receiving a first signal, a second operational amplifier receiving a second signal, and a first transistor. The first transistor includes a first gate, a first terminal, and a second terminal. Additionally, the apparatus includes a second transistor. The second transistor includes a second gate, a third terminal, and a fourth terminal. Moreover the apparatus includes a first resistor coupled to the first terminal and the third terminal, and a second resistor coupled to the second terminal and the fourth terminal. Also, the apparatus includes a first current supplier coupled to the first terminal, a second current supplier coupled to the second terminal, a third current supplier coupled to the third terminal, and a fourth current supplier coupled to the fourth terminal. Additionally, the apparatus includes a common-mode feedback device. The gate of the first transistor is coupled to the first operational amplifier, and the gate of the second transistor is coupled to the second operational amplifier. The second terminal is configured to output a third signal, and the fourth terminal is configured to output a fourth signal. The common-mode feedback device is configured to receive at least the third signal and the fourth signal, and the common-mode feedback device is configured to adjust the second current supplier and the fourth current supplier. A first difference between the fourth signal and the third signal is substantially proportional to a second difference between the first signal and the second signal.

According to yet another embodiment, a method for generating differential signals includes receiving a first signal and a second signal, and generating a third signal and a fourth signal. The third signal is substantially equal to the first signal, and the fourth signal is substantially equal to the second signal. Additionally, the method includes converting a first voltage difference between the third signal and the fourth signal to a first current, and generating a second current. The second current is substantially the same as the first current in magnitude. Moreover, the method includes converting the second current to a second voltage difference between a fifth signal and a sixth signal. The first voltage difference is proportional to the second voltage difference.

Many benefits are achieved by way of the present invention over conventional techniques. Some embodiments of the present invention convert voltage signals to differential current signals and then convert the differential current signals to differential voltage signals. For example, symmetrical high-bandwidth unity-gain buffers are used. Certain embodiments of the present invention consume little power. Some embodiments of the present invention provide high bandwidth for input voltage signals. Certain embodiments of the present invention do not use a clock signal and therefore do not rely on sampling frequency. Some embodiments of the present invention can be easily integrated into a digital circuit chip. Certain embodiments of the present invention can provide differential voltage signals for many applications, such as differential flash analog-to-digital converter. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits. More particularly, the invention provides an apparatus and method for generating differential signals. Merely by way of example, the invention has been applied to an analog-to-digital converter. But it would be recognized that the invention has a much broader range of applicability.

Figure 1:
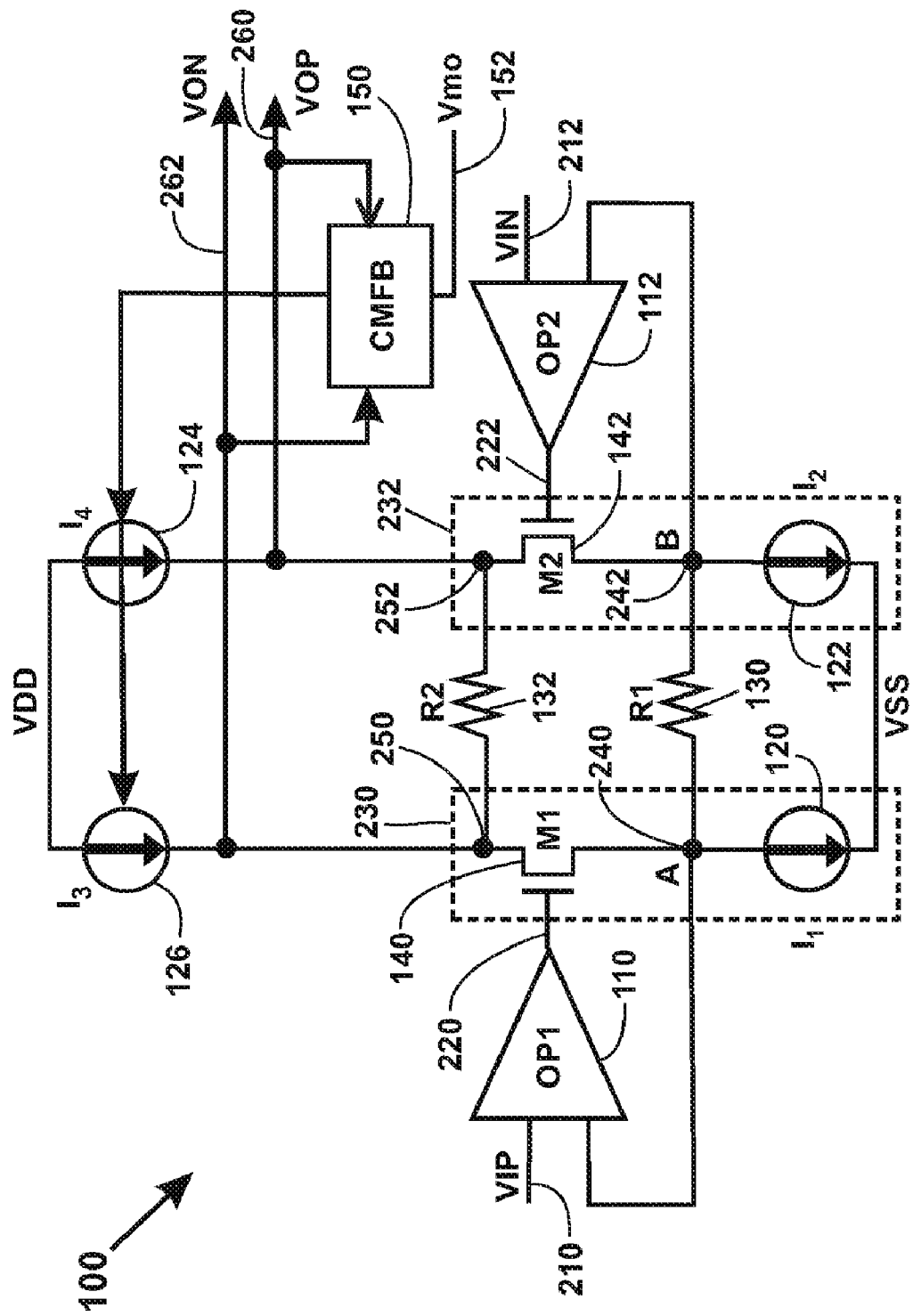
FIG. 1 is a simplified apparatus for generating differential signals according to an embodiment of the present invention.

FIG. 1 is a simplified apparatus for generating differential signals according to an embodiment of the present invention. This diagram is merely an example, which should not unduly limit the scope of the claims herein. The apparatus 100 includes the following components:

1. Operational Amplifiers 110 and 112;
2. Current suppliers 120, 122, 124, and 126;
3. Resistors 130 and 132;
4. Transistors 140 and 142;
5. Common-Mode Feedback Device 150.

The above electronic devices provide components for the apparatus 100 according to an embodiment of the present invention. Other alternatives can also be provided where certain devices are added, one or more devices are removed, or one or more devices are arranged with different connections without departing from the scope of the claims herein.

The operational amplifiers 110 and 112 receive input signals 210 and 212 at their positive terminals respectively. For example, the input signals 210 and 212 are analog signals. In another example, the operational amplifiers 110 and 112 are the same. As shown in FIG. 1, the output signal 220 of the operational amplifier 110 is received by a source follower 230, and the output signal 222 of the operational amplifier 112 is receive by another source follower 232. The source follower 230 includes the current supplier 120 and the transistor 140, and the source follower 232 includes the current supplier 122 and the transistor 142. For example, the transistor 140 is an NMOS transistor, and the transistor 142 is another NMOS transistor. In another example, the transistors 140 and 142 are the same. In yet another example, the current suppliers 120 and 122 are the same. In yet another example, the current suppliers 120 and 122 are coupled to a voltage source of $V_{SS}$. In yet another example, the source followers 230 and 232 are the same.

According to one embodiment, the operational amplifier 110 and the source follower 230 are configured as a unity gain follower, and the operational amplifier 112 and the source follower 232 are configured as another unity gain follower. The voltage level at a node 240 follows the signal 210, and the voltage level at a node 242 follows the signal 212. For example, the operational amplifiers 110 and 112 each have small capacitor loading. In another example, the voltage level at the node 240 duplicates the voltage level of the signal 210 within a high bandwidth, and the voltage level at the node 242 also duplicates the voltage level of the signal 212 within a high bandwidth. As shown in FIG. 1, the voltage at the node 240 is received by the operational amplifier 110, and the voltage at the node 242 is received by the operational amplifier 112.

The resistor 130 is coupled between the nodes 240 and 242. The current $I_{R1}$ flowing through the resistor 130 is determined as follows:

$$I_{R1} = \frac{V_A - V_B}{R_1} \quad \text{(Equation 1)}$$

where $V_A$ and $V_B$ represent the voltage levels at the nodes 240 and 242 respectively. If $V_{IP}$ and $V_{IN}$ represent the voltage levels of the signals 210 and 212 respectively, $V_{IP}$ is equal to $V_A$ and $V_{IN}$ is equal to $V_B$ according to an embodiment of the present invention. The current $I_{R1}$ loads the source followers 230 and 232, and results in another current $I_{R2}$ between nodes 250 and 252.

The nodes 250 and 252 are connected by the resistor 132 and are coupled to the current suppliers 126 and 124 respectively. The current $I_{R2}$ flows from the node 252 to the node 250 through the resistor 132. For example, the current suppliers 126 and 124 are the same. In another example, the current suppliers 126 and 124 are coupled to a voltage source of $V_{DD}$. As shown in FIG. 1, the current $I_{R2}$ is equal to the current $I_{R1}$, so the voltage difference between the nodes 252 and 250 is as follows:

$$V_{OP} - V_{ON} = \frac{R_2}{R_1} \times (V_A - V_B) \qquad \text{(Equation 2)}$$

where $V_{OP}$ and $V_{ON}$ represent the voltages levels at the nodes 252 and 250 respectively. As discussed above, $V_{IP}$ is equal to $V_A$ and $V_{IN}$ is equal to $V_B$ according to an embodiment of the present invention. Therefore, the difference between $V_{OP}$ and $V_{ON}$ is calculated as follows:

$$V_{OP} - V_{ON} = \frac{R_2}{R_1} \times (V_{IP} - V_{IN}) \qquad \text{(Equation 3)}$$

For example, $R_1$ is equal to $R_2$. Accordingly, $V_{OP}-V_{ON}=V_{IP}-V_{IN}$.

As shown in FIG. 1, $V_{OP}$ and $V_{ON}$ represent voltage levels of signals 260 and 262 respectively. The signals 260 and 262 are differential output signals, which are regulated by the common-mode feedback device 150. The common-mode feedback device 150 receives the signals 260 and 262, and a signal 152. The signal 152 is biased to a voltage level of $V_{m0}$. In one embodiment, a common mode voltage is an average of $V_{OP}$ and $V_{ON}$. In another embodiment, the common-mode feedback device 150 is used to adjust the common mode voltage. For example, the voltage level of $V_{m0}$ is predetermined. In another example, the voltage level of $V_{m0}$ is used as a common-mode voltage. Additionally, the common-mode feedback device 150 controls the current suppliers 126 and 124.

In one embodiment, the common-mode feedback device 150 receives the signals 260 and 262, and determines the average voltage level of $V_{OP}$ and $V_{ON}$. This average voltage level is compared with the voltage level of $V_{m0}$. If the average voltage level is different from the voltage level of $V_{m0}$, the common-mode feedback device adjusts the current suppliers 124 and 126 and thereby changes the signals 260 and 262 until the average voltage level becomes the same as the voltage level of $V_{m0}$. Accordingly, $V_{OP}$ and $V_{ON}$ are determined as follows:

$$V_{OP} = V_{m0} + \frac{1}{2}(V_{ip} - V_{in}) \qquad \text{(Equation 4)}$$

$$V_{ON} = V_{m0} - \frac{1}{2}(V_{ip} - V_{in}) \qquad \text{(Equation 5)}$$

As shown in Equations 4 and 5, the sum of $V_{OP}$ and $V_{ON}$ is equal to two times of $V_{m0}$.

As discussed above and further emphasized here, FIG. 1 is merely an example, which should not unduly limit the scope of the claims. One of ordinary skill in the art would recognize many variations, alternatives, and modifications. For example, the apparatus 100 can be used for a single-ended input signal or for differential input signals. For differential input signals, the input signals are connected as the signals 210 and 212. For single-ended input signal, the input signal is connected as one of the signals 210 and 212. The other one of the signals 210 and 212 is connected to a predetermined voltage level. For example, the predetermined voltage level is an input common-mode level. In another example, the predetermined voltage level is equal to 0 volt.

Figure 2:
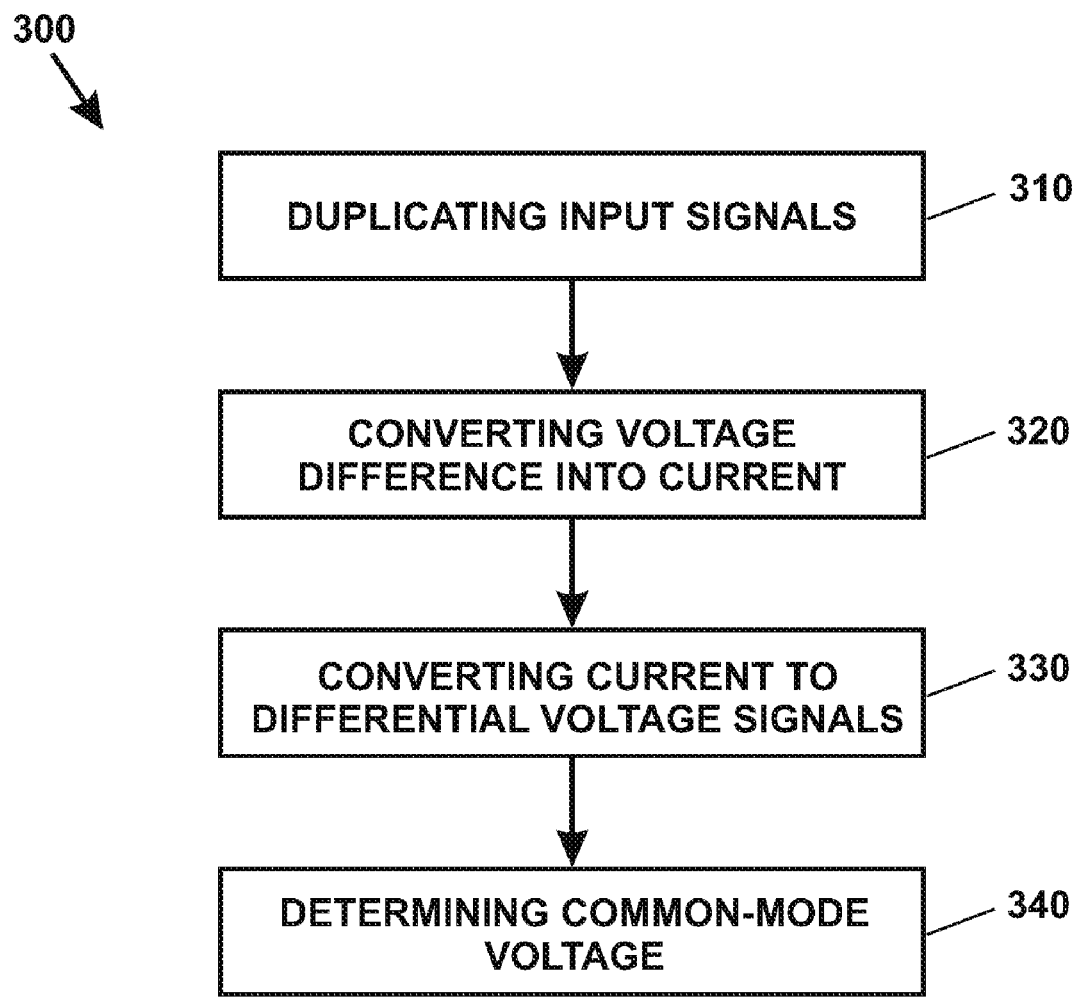
FIG. 2 is a simplified method for generating differential signals according to an embodiment of the present invention.

FIG. 2 is a simplified method for generating differential signals according to an embodiment of the present invention. This diagram is merely an example, which should not unduly limit the scope of the claims herein. The method 300 includes the following processes:

1. Process 310 for duplicating input signals;
2. Process 320 for converting voltage difference into current;
3. Process 330 for converting current to differential voltage signals;
4. Process 340 for determining common-mode voltage.

The above sequence of processes provides a method according to an embodiment of the present invention. Other alternatives can also be provided where processes are added, one or more processes are removed, or one or more processes are provided in a different sequence without departing from the scope of the claims herein. For example, the processes 330 and 340 are performed at the same time. Future details of the present invention can be found throughout the present specification and more particularly below.

For example, the method 300 can be performed by the apparatus 100 according to an embodiment of the present invention. At the process 310, the signal 210 is duplicated to the node 240 through the operational amplifier 110 and the source follower 230, and the signal 212 is duplicated to the node 242 through the operational amplifier 112 and the source follower 232.

At the process 320, the voltage difference between the nodes 240 and 242 is converted to the current $I_{R1}$ that flows through the resistor 130. At the process 330, the current $I_{R1}$ is duplicated into the current $I_{R2}$. The current $I_{R2}$ flows through the resistor 132, and converts the voltage difference between the signals 210 and 212 into the voltage difference between the signals 260 and 262. At the process 340, the common-mode voltage for the signals 260 and 262 are determined by the common-mode feedback device 150 through the current suppliers 124 and 126.

As discussed above and further emphasized here, FIG. 2 is merely an example, which should not unduly limit the scope of the claims. One of ordinary skill in the art would recognize many variations, alternatives, and modifications. For example, the method 300 can be used for a single-ended input signal or for differential input signals. For differential input signals, the input signals are connected as the signals 210 and 212. For single-ended input signal, the input signal is connected as one of the signals 210 and 212. The other one of the signals 210 and 212 is connected to an input common-mode level. For example, the input common-mode level is equal to 0 volt.

In another embodiment, an apparatus for generating differential signals includes a first operational amplifier receiving a first signal, a second operational amplifier receiving a second signal, and a first transistor. The first transistor includes a first gate, a first terminal, and a second terminal. Additionally, the apparatus includes a second transistor. The second transistor includes a second gate, a third terminal, and a fourth terminal. Moreover, the apparatus includes a first resistor coupled to the first terminal and the third terminal, and a second resistor coupled to the second terminal and the fourth terminal. Also, the apparatus includes a first current supplier coupled to the first terminal, a second current supplier coupled to the second terminal, a third current supplier coupled to the third terminal, and a fourth current supplier coupled to the fourth terminal. The gate of the first transistor is coupled to the first operational amplifier, the gate of the second transistor is coupled to the second operational amplifier, the second terminal is configured to output a third signal, and the fourth terminal is configured to output a fourth signal. A first difference between the fourth signal and the third signal is substantially proportional to a second difference between the first signal and the second signal. For example, the apparatus is implemented according to the apparatus 100.

In another embodiment, an apparatus for generating differential signals includes a first operational amplifier receiving a first signal, a second operational amplifier receiving a second signal, and a first transistor. The first transistor includes a first gate, a first terminal, and a second terminal. Additionally, the apparatus includes a second transistor. The second transistor includes a second gate, a third terminal, and a fourth terminal. Moreover the apparatus includes a first resistor coupled to the first terminal and the third terminal, and a second resistor coupled to the second terminal and the fourth terminal. Also, the apparatus includes a first current supplier coupled to the first terminal, a second current supplier coupled to the second terminal, a third current supplier coupled to the third terminal, and a fourth current supplier coupled to the fourth terminal. Additionally, the apparatus includes a common-mode feedback device. The gate of the first transistor is coupled to the first operational amplifier, and the gate of the second transistor is coupled to the second operational amplifier. The second terminal is configured to output a third signal, and the fourth terminal is configured to output a fourth signal. The common-mode feedback device is configured to receive at least the third signal and the fourth signal, and the common-mode feedback device is configured to adjust the second current supplier and the fourth current supplier. A first difference between the fourth signal and the third signal is substantially proportional to a second difference between the first signal and the second signal. For example, the apparatus is implemented according to the apparatus 100.

According to yet another embodiment, a method for generating differential signals includes receiving a first signal and a second signal, and generating a third signal and a fourth signal. The third signal is substantially equal to the first signal, and the fourth signal is substantially equal to the second signal. Additionally, the method includes converting a first voltage difference between the third signal and the fourth signal to a first current, and generating a second current. The second current is substantially the same as the first current in magnitude. Moreover, the method includes converting the second current to a second voltage difference between a fifth signal and a sixth signal. The first voltage difference is proportional to the second voltage difference. For example, the method is implemented according to the method 300.

The present invention has various advantages. Some embodiments of the present invention convert voltage signals to differential current signals and then convert the differential current signals to differential voltage signals. For example, symmetrical high-bandwidth unity-gain buffers are used. Certain embodiments of the present invention consume little power. Some embodiments of the present invention provide high bandwidth for input voltage signals. Certain embodiments of the present invention do not use a clock signal and therefore do not rely on sampling frequency. Some embodiments of the present invention can be easily integrated into a digital circuit chip. Certain embodiments of the present invention can provide differential voltage signals for many applications, such as differential flash analog-to-digital converter.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for generating differential signals, the apparatus comprising:
   a first operational amplifier receiving a first signal;
   a second operational amplifier receiving a second signal;
   a first transistor, the first transistor including a first gate, a first terminal, and a second terminal;
   a second transistor, the second transistor including a second gate, a third terminal, and a fourth terminal;
   a first resistor coupled to the first terminal and the third terminal;
   a second resistor coupled to the second terminal and the fourth terminal;
   wherein:
   the first gate is coupled to the first operational amplifier;
   the second gate is coupled to the second operational amplifier;
   the second terminal is configured to output a third signal;
   the fourth terminal is configured to output a fourth signal;
   a first difference between the fourth signal and the third signal is substantially proportional to a second difference between the first signal and the second signal.

2. The apparatus of claim 1 wherein:
   the first signal corresponds to one input signal;
   the second signal corresponds to another input signal.

3. The apparatus of claim 1 wherein:
   the first signal corresponds to one input signal;
   the second signal is biased to a predetermined voltage level.

4. The apparatus of claim 1, and further comprising a common-mode feedback device, the common-mode feedback device being configured to receive at least the third signal and the fourth signal and to adjust a first current supplier coupled to the second terminal and to adjust a second current supplier coupled to the fourth terminal.

5. The apparatus of claim 4 wherein a sum of the third signal and the fourth signal is substantially equal to two times of a common-mode voltage.

6. The apparatus of claim 4 wherein the first current supplier and the second current supplier are the same.

7. The apparatus of claim 1 wherein the first transistor and the second transistor are the same.

8. The apparatus of claim 1 wherein the first transistor is an NMOS transistor, and the second transistor is another NMOS transistor.

9. The apparatus of claim 1 wherein the first operational amplifier and the second operational amplifier are the same.

10. The apparatus of claim 1 wherein the first resistor and the second resistor are the same.

11. The apparatus of claim 10 wherein the first difference between the fourth signal and the third signal is substantially the same as the second difference between the first signal and the second signal.

12. The apparatus of claim 1 wherein the first operational amplifier receives a fifth signal from the first terminal, and the second operational amplifier receives a sixth signal from the second terminal.

13. The apparatus of claim 1 wherein the first terminal is one selected from a group consisting of a first source and a first drain, and the second terminal is the other one selected from a group consisting of the first source and the first drain.

14. The apparatus of claim 1 wherein the third terminal is one selected from a group consisting of a second source and a second drain, and the fourth terminal is the other one selected from a group consisting of the second source and the second drain.

15. An apparatus for generating differential signals, the apparatus comprising:
   a first operational amplifier receiving a first signal;
   a second operational amplifier receiving a second signal;
   a first transistor, the first transistor including a first gate, a first terminal, and a second terminal;
   a second transistor, the second transistor including a second gate, a third terminal, and a fourth terminal;
   a first resistor coupled to the first terminal and the third terminal;
   a second resistor coupled to the second terminal and the fourth terminal;
   a common-mode feedback device;
   wherein:
      the first gate is coupled to the first operational amplifier;
      the second gate is coupled to the second operational amplifier;
      the second terminal is configured to output a third signal;
      the fourth terminal is configured to output a fourth signal;
      the common-mode feedback device is configured to receive at least the third signal and the fourth signal;
      a first difference between the fourth signal and the third signal is substantially proportional to a second difference between the first signal and the second signal.

16. The apparatus of claim 15 wherein:
   the first signal corresponds to one input signal;
   the second signal corresponds to another input signal.

17. The apparatus of claim 15 wherein:
   the first signal corresponds to one input signal;
   the second signal is biased to a predetermined voltage level.

18. The apparatus of claim 15 wherein the common-mode feedback device is biased to a predetermined voltage level.

19. The apparatus of claim 18 wherein a sum of the third signal and the fourth signal is substantially equal to two times of the predetermined voltage level.

* * * * *